United States Patent
Kim et al.

(10) Patent No.: US 7,037,828 B2
(45) Date of Patent: May 2, 2006

(54) SEMICONDUCTOR DEVICE HAVING A CAPPING LAYER INCLUDING COBALT AND METHOD OF FABRICATING THE SAME

(75) Inventors: Jung-Wook Kim, Gyeonggi-do (KR); Hyeon-Deok Lee, Seoul (KR); In-Sun Park, Gyeonggi-do (KR); Ji-Soon Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/916,303

(22) Filed: Aug. 10, 2004

(65) Prior Publication Data

US 2005/0046027 A1  Mar. 3, 2005

(30) Foreign Application Priority Data

Aug. 27, 2003  (KR) .................. 10-2003-0059492

(51) Int. Cl.
  *H01L 21/44*  (2006.01)
(52) U.S. Cl. ...................... 438/652; 438/660
(58) Field of Classification Search ............. 438/642, 438/655, 682, 652, 660, 661
  See application file for complete search history.

(56) References Cited

U.S. PATENT DOCUMENTS 5,047,367 A * 9/1991 Wei et al. .................. 438/607
5,482,895 A * 1/1996 Hayashi et al. ............. 438/620
5,536,684 A * 7/1996 Dass et al. .................. 438/535
5,998,873 A * 12/1999 Blair et al. .................. 257/766
6,096,599 A * 8/2000 Kepler et al. ............... 438/249
6,653,227 B1 * 11/2003 Lai et al. .................... 438/633
6,916,729 B1 * 7/2005 Fang et al. .................. 438/583
6,943,110 B1 * 9/2005 Lur et al. .................... 438/683

FOREIGN PATENT DOCUMENTS

| JP | 07115198 A | * | 5/1995 |
| KR | 1996-42969 | | 12/1996 |
| KR | 1999-50404 | | 11/1999 |
| KR | 2000-66420 | | 11/2000 |

OTHER PUBLICATIONS

English language Abstract for Korean patent publication No. 2000-66420.
English language abstract for Korean Publication No. 1996-42969.
English language Abstract for Korean patent publication No. 1999-50404.

* cited by examiner

*Primary Examiner*—Matthew Smith
*Assistant Examiner*—Lex H. Malsawma
(74) *Attorney, Agent, or Firm*—Marger Johnson & McCollom, P.C.

(57) ABSTRACT

A semiconductor device, and a method of fabricating the same, includes cobalt as a capping layer. An interconnection structure of the semiconductor device has an improved via resistance. In the semiconductor device, a single cobalt layer or a composite film including a cobalt layer and a titanium nitride layer is used as the capping layer of a metal layer.

12 Claims, 5 Drawing Sheets

SEMICONDUCTOR DEVICE HAVING A CAPPING LAYER INCLUDING COBALT AND METHOD OF FABRICATING THE SAME

This application claims the priority of Korean Patent Application No. 2003-59492, filed on Aug. 27, 2003, in the Korean Intellectual Property Office, the disclosure of which is incorporated herein in its entirety by reference.

BACKGROUND OF THE INVENTION

1. Field of the Invention

The present invention relates to a semiconductor device and a method of fabricating the same, and more particularly, to a capping layer of a metal pattern formed in a back-end process among semiconductor device fabrication processes.

2. Description of the Related Art

As the integration of semiconductor devices increases, the design rules of semiconductor devices must account for decreasing structure sizes. As the design rule decreases, the size of an individual device such as a transistor in a semiconductor device decreases also, and the process for interconnecting the individual devices via a metal interconnection becomes more important. In particular, in semiconductor devices requiring high speed operation, various attempts to reduce the resistance of the metal interconnection are being made.

Examples of such attempts to reduce the interconnection resistance include replacing the metal interconnection of aluminum (Al) with a metal interconnection of copper (Cu), using a barrier layer in a contact hole to connect the metal interconnections.

A prior art example of using a cobalt layer as the barrier layer in a contact hole is disclosed in U.S. Pat. No. 5,998,873. However, this prior art is directed not to a capping layer covering the entire surface of the metal layer, but to a cobalt layer restricted only to the inside of the contact hole.

SUMMARY OF THE INVENTION

The present invention provides a semiconductor device employing a cobalt layer as a capping layer so as to improve via resistance of the semiconductor device.

The present invention also provides a method of manufacturing a semiconductor device with a cobalt layer employed as a capping layer.

According to an embodiment of the present invention, there is provided a semiconductor device comprising: a semiconductor substrate on which a structure including a transistor is formed; a lower capping layer formed on the semiconductor substrate; a metal layer formed on the lower capping layer; an upper capping layer formed on the metal layer, covering an entire surface of the metal layer, and including at least a cobalt layer; an interlayer insulating layer pattern formed on the upper capping layer, and having a contact hole; and a contact plug filling the contact hole of the interlayer insulating layer pattern.

The lower capping layer may be one selected from the group consisting of a composite film including a cobalt layer and a titanium nitride layer stacked sequentially, a cobalt layer, and a composite film including a titanium layer and a titanium nitride layer stacked sequentially.

According to another embodiment of the present invention, there is provided a semiconductor device comprising: a semiconductor substrate on which a structure including a transistor is formed; a lower capping layer formed on the semiconductor substrate, and including at least one cobalt layer; a metal layer formed on the lower capping layer; an upper capping layer formed on the metal layer, and covering substantially the entire surface of the metal layer; an interlayer insulating layer pattern formed on the upper capping layer, and having a contact hole; and a contact plug filling the contact hole of the interlayer insulating layer pattern.

The upper capping layer may be one selected from the group consisting of a composite film including a cobalt layer and a titanium nitride layer stacked sequentially, a single cobalt layer, and a composite film including a titanium layer and a titanium nitride layer stacked sequentially.

According to yet another embodiment of the present invention, there is provided a method of manufacturing a semiconductor device, the method comprising: preparing a semiconductor substrate on which a structure including a transistor is formed; forming a lower capping layer on the semiconductor substrate; forming a metal layer on the lower capping layer; forming an upper capping layer including at least one cobalt layer on the metal layer to cover substantially the entire surface of the metal layer; patterning the upper capping layer and the metal layer to form a metal layer pattern; performing an alloy process on the metal layer pattern; forming an interlayer insulating layer pattern with a contact hole on the upper capping layer; and forming a contact plug in the contact hole of the interlayer insulating layer pattern.

The upper capping layer may be one of a cobalt layer, and a composite film including a cobalt layer and a titanium nitride layer stacked sequentially.

Also, the lower capping layer may be one selected from the group consisting of a cobalt layer, a composite film including a cobalt layer and a titanium nitride layer stacked sequentially, and a composite film including a titanium layer and a titanium nitride layer stacked sequentially.

According to still another embodiment of the present invention, there is provided a method of manufacturing a semiconductor device, the method comprising: preparing a semiconductor substrate on which a structure including a transistor is formed; forming a lower capping layer including at least one cobalt layer on the semiconductor substrate; forming a metal layer on the lower capping layer; forming an upper capping layer on the metal layer to cover substantially the entire surface of the metal layer; patterning the upper capping layer and the metal layer to form a metal layer pattern; performing an alloy process on the metal layer pattern; forming an interlayer insulating layer pattern with a contact hole on the capping layer; and forming a contact plug in the contact hole of the interlayer insulating layer pattern.

The lower capping layer may be one of a cobalt layer, and a composite film including a cobalt layer and a titanium nitride layer stacked sequentially.

The upper capping layer may be one selected from the group consisting of a cobalt layer, a composite film including a cobalt layer and a titanium nitride layer stacked sequentially, and a composite film including a titanium layer and a titanium nitride layer stacked sequentially.

According to the embodiments of the present invention, a cobalt layer or a composite film including a cobalt layer is used as the capping layer of the metal layer to improve via resistance in the metal interconnection process, thereby improving the speed performance of a semiconductor device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art.

It will be understood by those of ordinary skill in the art that various changes in form and details may be made to be embodiments without departing from the spirit and scope of the present invention. For instance, a cobalt layer may be replaced by an equivalent layer having a low resistivity such as a nickel (Ni) layer or a copper (Cu) layer. Also, it will be understood by those of ordinary skill in the art that in the below exemplary embodiments, the composite layer of a cobalt layer and a titanium nitride layer used as the capping layer can be replaced by a composite layer of a nickel layer and a titanium nitride layer or a composite layer of a copper layer and a titanium nitride layer.

Figure 1:
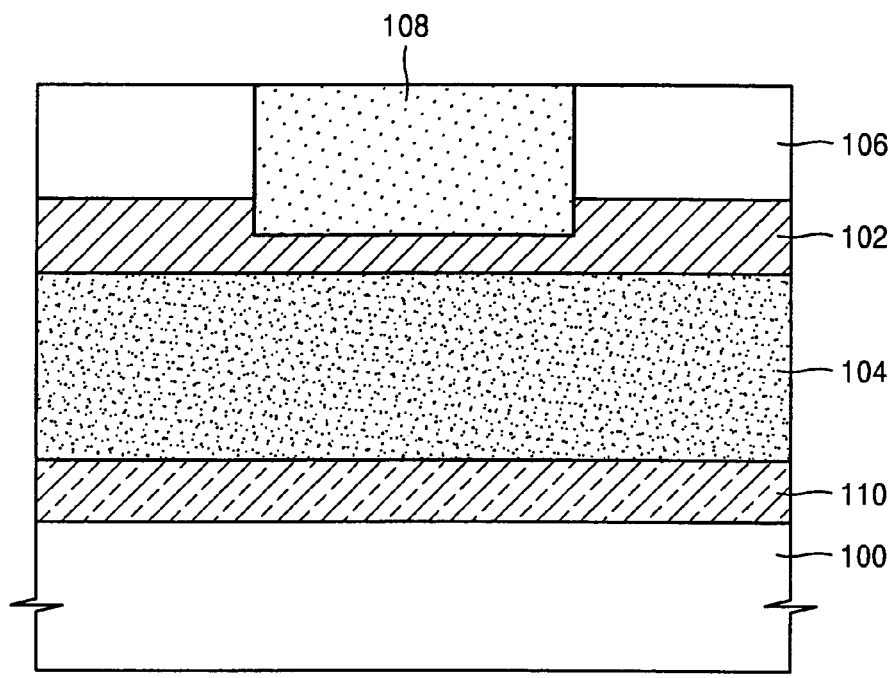
FIG. 1 is a sectional view of a semiconductor device employing a single cobalt layer as an upper capping layer according to a first embodiment of the present invention.

FIG. 1 is a sectional view of a semiconductor device employing a single cobalt layer as an upper capping layer according to the first embodiment of the present invention.

Referring to FIG. 1, the semiconductor device includes a semiconductor substrate 100 having a structure including a transistor formed thereon. A lower capping layer 110 is formed on the semiconductor substrate 100 and a metal layer 104 formed on the lower capping layer 110 acts as a metal interconnection. An upper capping layer 102 formed of cobalt is disposed on the metal layer 104, and an interlayer insulating layer 106 with a contact hole is disposed on the upper capping layer 102. A contact plug 108 fills the contact hole of the interlayer insulating layer 106.

The capping layers 102 and 110 cover substantially the entire surfaces of the metal layer 104, thereby enhancing the conductivity of the metal interconnection, and have different characteristics than the characteristics of the layer formed only inside the contact hole. Also, the capping layers 102 and 110 are formed in the back-end process of semiconductor fabrication after forming transistors.

The lower capping layer 110 can be formed of various materials that enhance the conductivity of the metal layer 104. For instance, the lower capping layer 110 can be formed of one selected from the group consisting of a single cobalt layer identical to the upper capping layer 102, a composite film of a cobalt layer and a titanium nitride layer, and a composite film of a titanium layer and a titanium nitride layer.

The metal layer 104 can be formed of aluminum (Al). The interlayer insulating layer 106 may be fanned of an oxide-based composite film, for example, a composite film of a tetraethylorthosilicate (TEOS) layer and a field oxide (FOX) layer. The contact plug 108 may be formed of tungsten or aluminum reflow.

Cobalt used to form the upper capping layer 102 has a relative resistance of 18 µΩ, which is very low compared to 66 µΩ, the relative resistance of titanium (Ti). Hence, if the upper capping layer 102 is formed of cobalt on the metal layer 104 at a thickness of approximately 50–1,000 angstroms, the via resistance of the metal interconnection is remarkably improved, thereby enhancing the electrical performance and the speed of a semiconductor device, such as SRAM.

Figure 2:
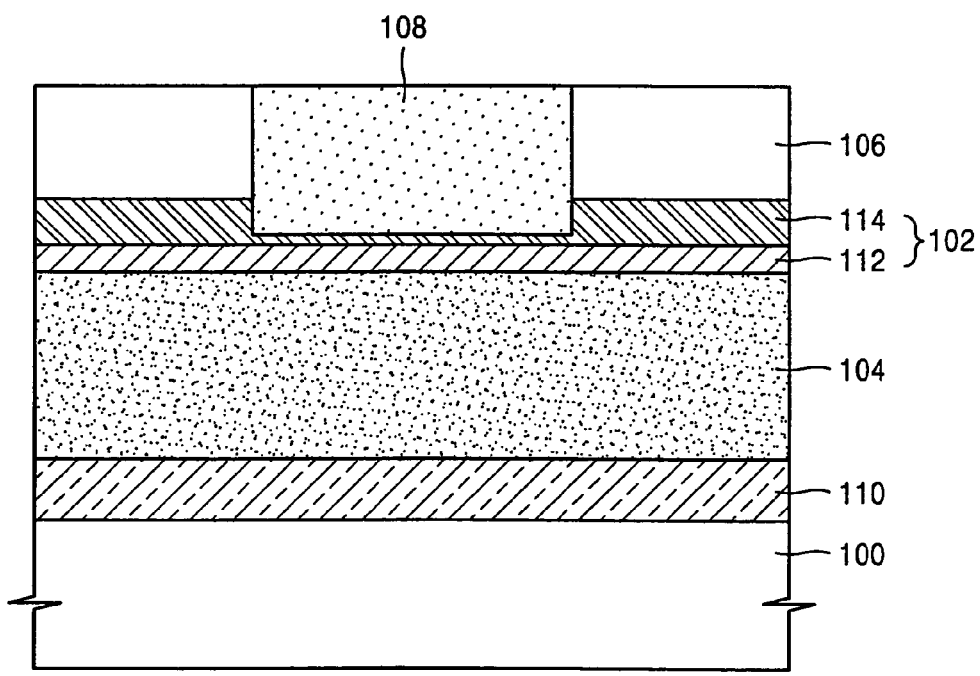
FIG. 2 is a sectional view of a semiconductor device employing a composite film of a cobalt layer and a titanium nitride layer as an upper capping layer according to a second embodiment of the present invention.

FIG. 2 is a sectional view of a semiconductor device employing a composite film of a cobalt layer and a titanium nitride layer as an upper capping layer according to the second embodiment of the present invention. A description of components identical to components in the device of FIG. 1 is omitted.

As opposed to the semiconductor device according to the first embodiment, the semiconductor device of the second embodiment includes an upper capping layer 102 composed of a composite film of a cobalt layer 112 and a titanium nitride layer 114, not a single cobalt layer. Accordingly, the upper capping layer 102 acts as an anti reflective layer (ARL) when patterning the metal layer 104. Also, the titanium nitride layer 114 of the upper capping layer acts as an etching stopper when forming a contact hole in the interlayer insulating layer 106. Preferably, the cobalt layer 112 is formed by an in-situ process to a thickness range of 20–500 angstroms and the titanium nitride layer 114 is formed by an in-situ process using a sputtering apparatus to a thickness range of 100–1,000 angstroms.

A method of manufacturing a semiconductor device having a cobalt layer will now be described with reference to FIG. 2.

First, a semiconductor substrate 100 having a structure including a transistor formed thereon is prepared. The structure is preferably a structure requiring fast speed, such as SRAM. Next, a metal interconnection is formed. For this purpose, a composite film of a titanium layer and a titanium nitride (TiN) layer is formed as a lower capping layer 110 on the semiconductor substrate 100. The lower capping layer 110 is preferably formed using an SIP (Self-Ionized Plasma) sputtering method such that the titanium layer has a thickness of, for example, 150 angstroms and the titanium nitride layer has a thickness of, for example, 300 angstroms. The lower capping layer 110 may also be a single cobalt layer or a composite film of a cobalt layer and a titanium nitride layer.

Then, a metal layer 104, for example, an aluminum layer, is deposited by a conventional thin film deposition process such as a sputtering process. Thereafter, an upper capping layer 102 is formed on the metal layer 104. For this purpose, a cobalt layer 112 is first formed by an ALPS (Al Low Pressure Sputtering) process. To form the cobalt layer 112, the semiconductor substrate 100 on which the lower capping layer 110 and the metal layer 104 are formed is positioned on an ESC (Electro-Static Chuck), and then an Ar gas is supplied as a carrier gas at a temperature of about 150° C. Preferably, the cobalt layer 112 is formed to a thickness of, for example, 50 angstroms. Next, a titanium nitride layer 114 is formed to a thickness of approximately 400 angstroms on the cobalt layer 112 using a generally well-known process. Preferably, the cobalt layer 112 and the titanium nitride layer 114 are formed in-situ by the sputtering apparatus.

Thereafter, the upper capping layer 102 and the metal layer 104 are patterned, thereby forming a metal layer pattern. For this purpose, a hard mask pattern including a composite film of a silicon oxynitride (SiON) layer and a plasma-enhanced oxide (PEOX) layer may be fanned as an ARL on the upper capping layer 102. The upper capping layer 102 and the metal layer 104 are etched using the hard mask pattern as an etch mask.

An alloy process is formed on the resultant structure. For the alloy process, a TEOS layer with a thickness of about 500 angstroms is deposited on the resultant structure. Then, the resultant structure is thermally annealed in a hydrogen atmosphere at a temperature of about 380° C. for about 30 minutes. This alloy process is performed to suppress the occurrence of an electro-migration (EM) phenomenon in which the metal layer 104 is moved by heat during a subsequent process, and to suppress the occurrence of voids in a subsequent process of filling a via contact hole with a conductive material.

Thereafter, an interlayer insulating layer 106 is deposited on the resultant structure, and is then planarized by a conventional planarization process such as chemical mechanical polishing (CMP). The interlayer insulating layer 106 can be a composite film including a Fox layer with a thickness of, for example, 2,600 angstroms and a TEOS layer with a thickness of 4,000 angstroms. Then, the interlayer insulating layer 106 is patterned to form a via contact hole exposing a part of the upper capping layer 102. The titanium nitride layer 114 of the upper capping layer 102 functions as an etching stopper when the via contact hole is formed. Thereafter, a contact plug 108 filling the contact hole is formed of aluminum reflow or tungsten.

Figure 3:
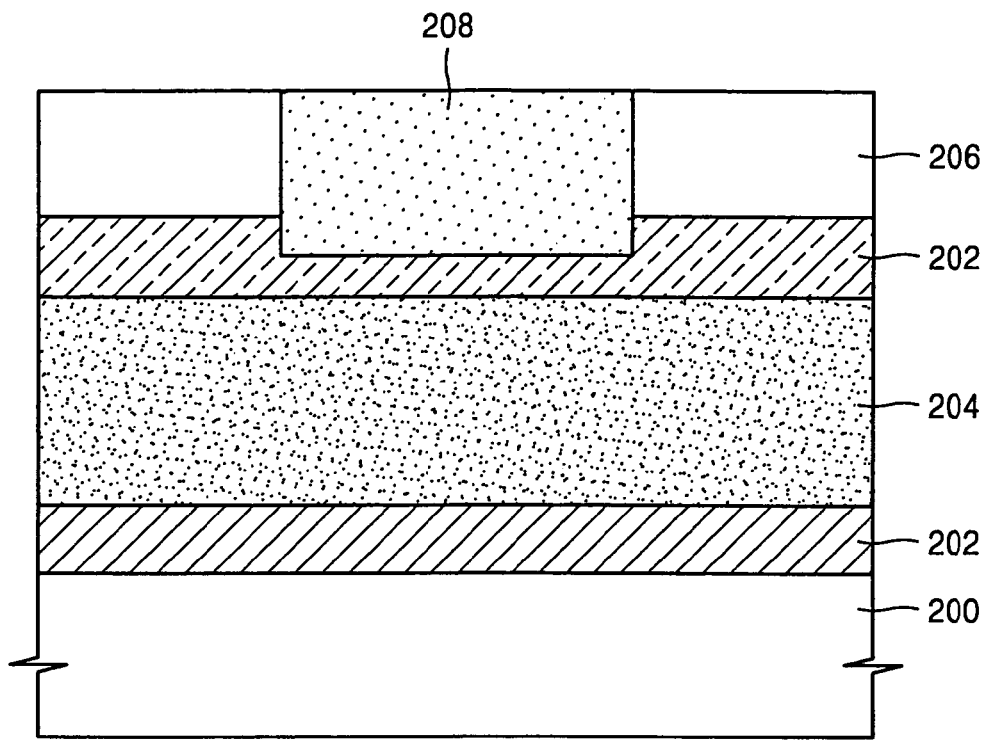
FIG. 3 is a sectional view of a semiconductor device employing a single cobalt layer as a lower capping layer according to a third embodiment of the present invention.
Figure 4:
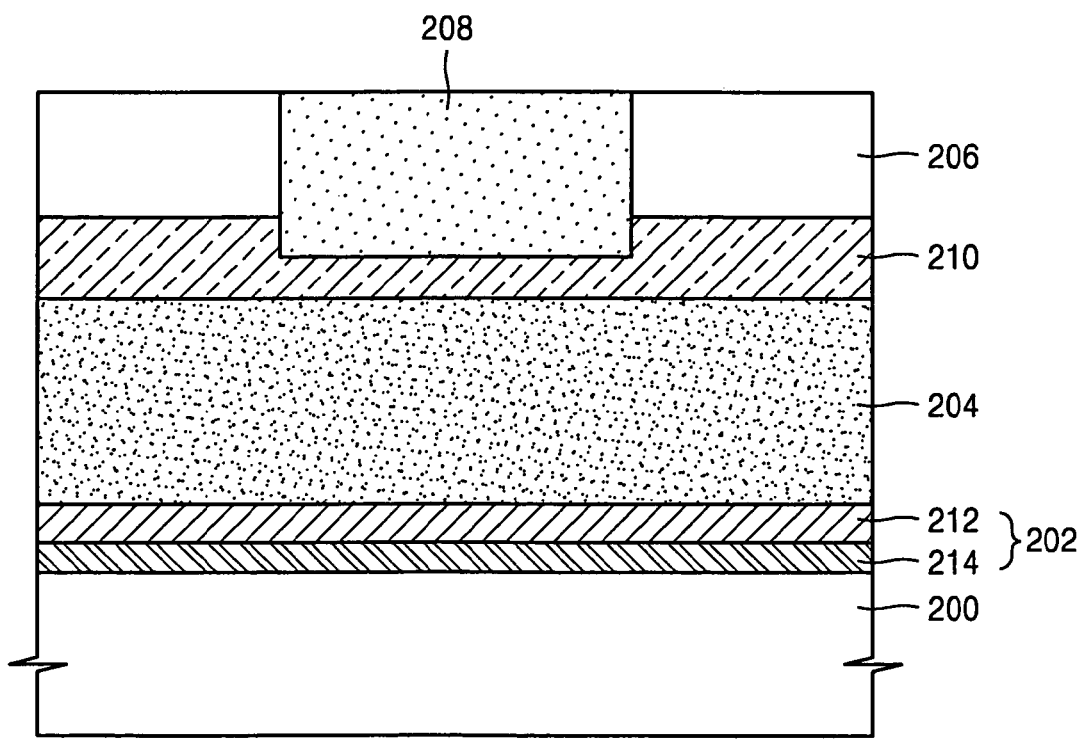
FIG. 4 is a sectional view of a semiconductor device employing a composite film of a cobalt layer and a titanium nitride layer as a lower capping layer according to a fourth embodiment of the present invention.

FIG. 3 is a sectional view of a semiconductor device employing a single cobalt layer as a lower capping layer according to the third embodiment of the present invention, and FIG. 4 is a sectional view of a semiconductor device employing a composite film of a cobalt layer and a titanium nitride layer as a lower capping layer according to the fourth embodiment of the present invention. The description overlapping with that of the aforementioned first embodiment will be omitted hereinbelow.

Referring to FIGS. 3 and 4, a semiconductor device includes a single cobalt layer as a lower capping layer 202 or a composite film including a cobalt layer 212 and a titanium nitride layer 214 as the lower capping layer 202. As in the first and second embodiments, the upper capping layer 210 can be formed of various materials that enhance the conductivity of a metal layer 204. For instance, the upper capping layer 210 can be formed of one selected from the group consisting of a single cobalt layer identical to the lower capping layer 202, a composite film including a cobalt layer and a titanium nitride layer, and a composite film including a titanium layer and a titanium nitride layer.

Figure 5:
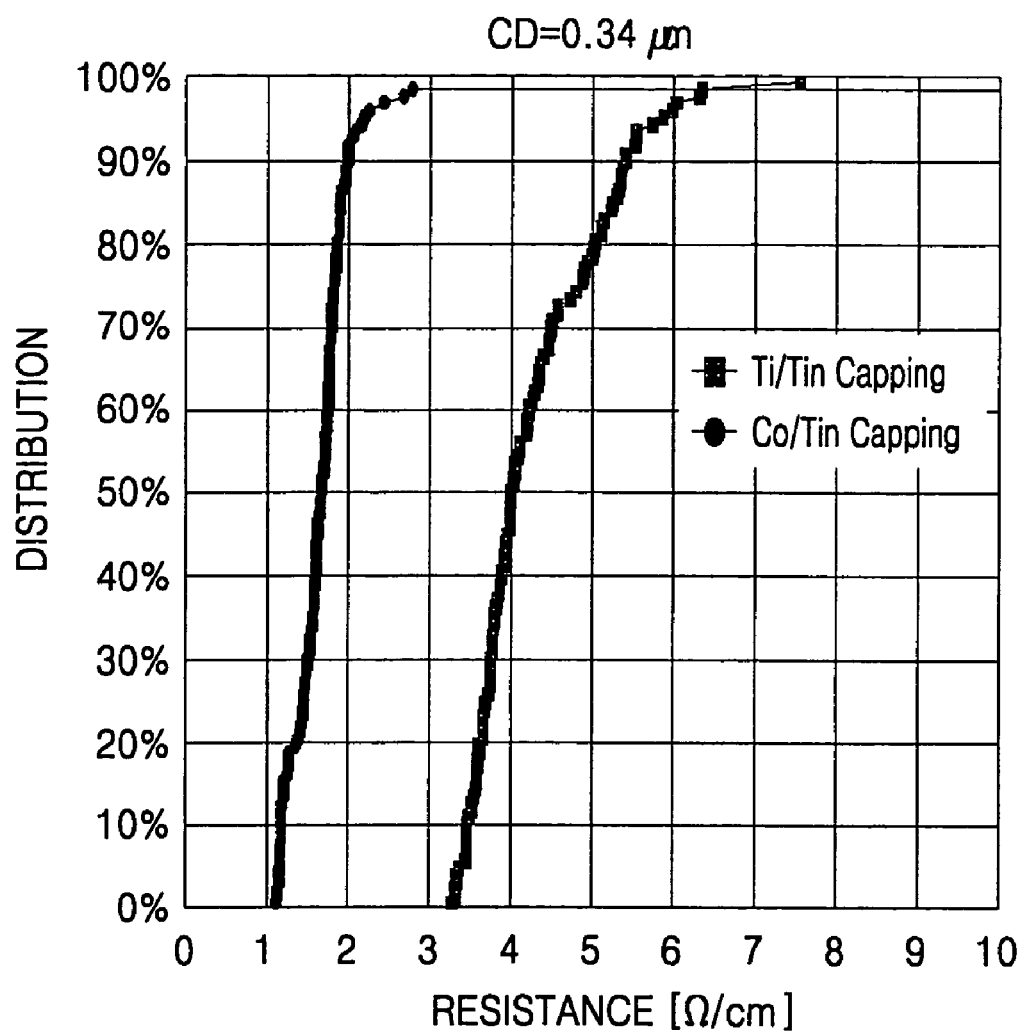
FIGS. 5 to 7 are graphs for illustrating a via resistance when a composite film is employed as an upper capping layer in a semiconductor device as shown in FIG. 2.
Figure 6:
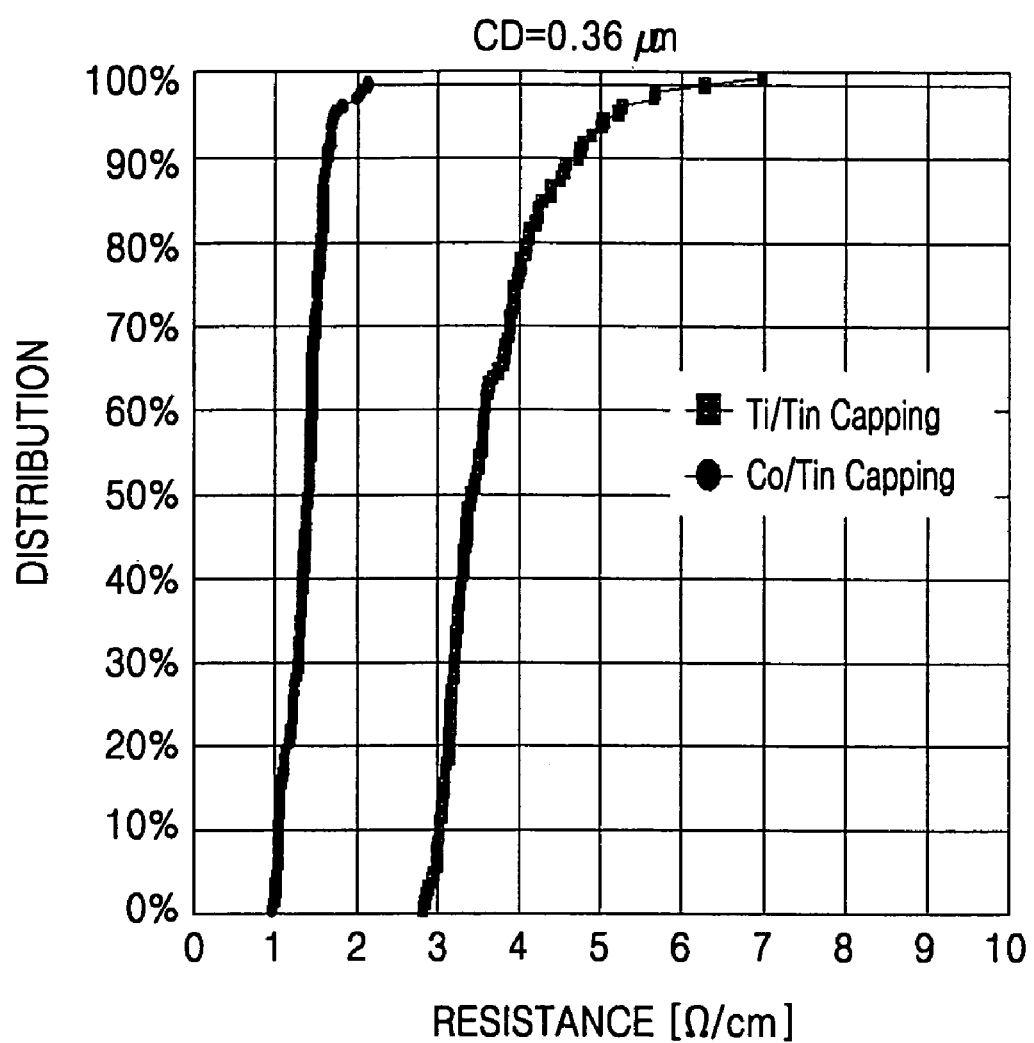
Figure 7:
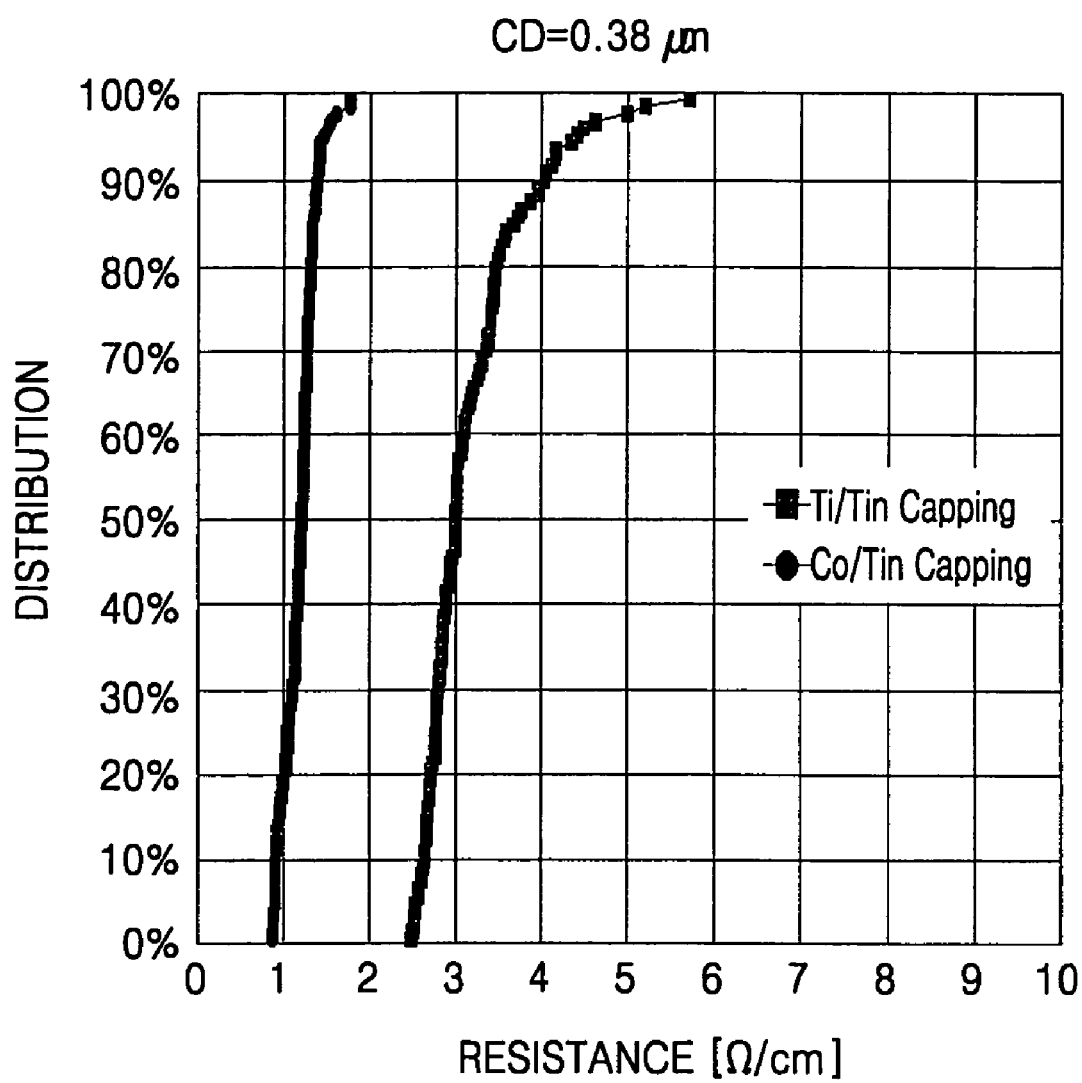

FIGS. 5 to 7 are graphs illustrating a via resistance when a composite film is employed as an upper capping layer in a semiconductor device as shown in FIG. 2.

Referring to FIGS. 5 to 7, a semiconductor substrate was fabricated using the composite film including the cobalt layer and the titanium nitride layer as the upper capping layer as illustrated in FIG. 2. For the comparison, a conventional semiconductor device employing a composite film including a titanium layer and a titanium nitride layer as an upper capping layer was used. Except for the upper capping layer, the structure was the same for the two cases. Also, except for the forming of the upper capping layer, the methods of fabricating the semiconductor devices were identical. Via resistances were measured in both cases. Here, FIG. 5 corresponds to a case where the via contact hole of the interlayer insulating layer has a critical dimension of 0.34 µm, FIG. 6 corresponds to a case where the via contact hole of the interlayer insulating layer has a thickness of 0.36 µm, and FIG. 7 corresponds to a case where the via contact hole of the interlayer insulating layer has a critical dimension of 0.38 µm.

In each graph, the Y-axis indicates distribution and the X-axis indicates resistance. Lines represented by ● correspond to a case when the composite film including cobalt layer (50 Å) and a titanium nitride layer (400 angstroms) was employed as the upper capping layer like FIG. 2, and Lines represented by ■ correspond to a case where the composite film including a titanium layer (50 angstroms) and a titanium nitride layer (400 angstroms) was employed as the upper capping layer.

In a semiconductor device having via contact holes with different sizes, when the composite film including cobalt layer (50 angstroms) and a titanium nitride layer (400 angstroms) was employed as the upper capping layer, the via resistance was 1–3 Ω/cm, and in the case where the composite film of titanium layer (50 angstroms)/titanium nitride layer (400 angstroms) was employed as the upper capping layer, the via resistance was 4–7 Ω/cm. This result shows that the via resistance characteristics of the capping layer including the cobalt layer are improved by about 200%.

As described above, according to embodiments of the present invention, among others, when a cobalt layer or a composite film including a cobalt layer is used as the capping layer of the metal layer, it is possible to improve via resistance of the metal interconnection.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor device, the method comprising:
    preparing a semiconductor substrate on which a structure including a transistor is formed;
    forming a lower capping layer on the semiconductor substrate;
    forming a metal layer an the lower capping layer;
    forming an upper capping layer including at least one cobalt layer on the metal layer to cover an entire surface of the metal layer;
    patterning the upper capping layer and the metal layer to form a metal layer pattern;
    performing an alloy process on the metal layer pattern;
    forming an interlayer insulating layer pattern with a contact hole overlying the upper capping layer; and
    forming a contact plug in the contact hole within the interlayer insulating layer pattern.

2. The method of claim 1, wherein the upper capping layer is one selected from the group consisting of a cobalt layer, and a composite film including a cobalt layer and a titanium nitride layer stacked sequentially.

3. The method of claim 1, wherein the lower capping layer is one selected from the group consisting of a cobalt layer, a composite film including a cobalt layer and a titanium nitride layer stacked sequentially, and a composite film including a titanium layer and a titanium nitride layer stacked sequentially.

4. The method of claim 1, wherein the patterning the upper capping layer and the metal layer to form the metal layer pattern involves the use of a composite film including SiON and PEOX as a hard mask.

5. The method of claim 1, wherein the performing the alloy process comprises:
   depositing a TEOS layer on the metal layer pattern; and
   thermally annealing the resultant structure including the TEOS layer in a hydrogen atmosphere at a temperature range of about 380±50° C. for about 30 minutes.

6. The method of claim 1, wherein the interlayer insulating layer is a composite film including a FOX layer and a PEOX layer.

7. A method for manufacturing a semiconductor device, the method comprising:
   preparing a semiconductor substrate on which a structure including a transistor is formed;
   forming a lower capping layer including at least one cobalt layer on the semiconductor substrate;
   forming a metal layer on the lower capping layer;
   forming an upper capping layer on the metal layer to cover an entire surface of the metal layer;
   patterning the upper capping layer and the metal layer to form a metal layer pattern;
   performing an alloy process on the metal layer pattern;
   forming an interlayer insulating layer pattern with a contact hole on the upper capping layer; and
   forming a contact plug in the contact hole of the interlayer insulating layer pattern.

8. The method of claim 7, wherein the lower capping layer is one selected from the group consisting of a cobalt layer, and a composite film including a cobalt layer and a titanium nitride layer stacked sequentially.

9. The method of claim 7, wherein the upper capping layer is one selected from the group consisting of a cobalt layer, a composite film including a cobalt layer and a titanium nitride layer stacked sequentially, and a composite film including a titanium layer and a titanium nitride layer stacked sequentially.

10. The method of claim 7, wherein the patterning the upper capping layer and the metal layer to form the metal layer pattern involves the use of a composite film including SiON and PEOX as a hard mask.

11. The method of claim 7, wherein the performing the alloy process comprises:
   depositing a TEOS layer on the metal layer pattern; and
   thermally annealing the resultant structure including the TEOS layer in a hydrogen atmosphere at a temperature range of about 380±50° C., for about 30 minutes.

12. The method of claim 7, wherein the interlayer insulating layer is a composite film including a Fox layer and a PEOX layer.

* * * * *

UNITED STATES PATENT AND TRADEMARK OFFICE
CERTIFICATE OF CORRECTION

| | | |
|---|---|---|
| PATENT NO. | : 7,037,828 B2 | Page 1 of 1 |
| APPLICATION NO. | : 10/916303 | |
| DATED | : May 2, 2006 | |
| INVENTOR(S) | : Jung-Wook Kim et al. | |

It is certified that error appears in the above-identified patent and that said Letters Patent is hereby corrected as shown below:

Column 4, line 12, the word "fanned" should read -- formed --.

Signed and Sealed this

Twenty-eighth Day of July, 2009

JOHN DOLL
*Acting Director of the United States Patent and Trademark Office*